United States Patent
Musseau et al.

(10) Patent No.: US 12,184,193 B2
(45) Date of Patent: Dec. 31, 2024

(54) INVERTER COMPRISING A DEVICE FOR THE MUTUAL ALIGNMENT OF THREE COMPONENTS

(71) Applicant: NIDEC PSA EMOTORS, Carrieres sous Poissy (FR)

(72) Inventors: Nicolas Musseau, Premilhat (FR); Guillaume Tardy, La Celle Saint Cloud (FR); Gael Blondel, Seine Fort (FR); Quentin Delaire, Sevres (FR)

(73) Assignee: Nidec PSA Emotors, Carrieres sous Poissy (FR)

( * ) Notice: Subject to any disclaimer, the term of this patent is extended or adjusted under 35 U.S.C. 154(b) by 0 days.

(21) Appl. No.: 18/710,120

(22) PCT Filed: Nov. 14, 2022

(86) PCT No.: PCT/FR2022/000106
§ 371 (c)(1),
(2) Date: May 14, 2024

(87) PCT Pub. No.: WO2023/089249
PCT Pub. Date: May 25, 2023

(65) Prior Publication Data
US 2024/0333169 A1    Oct. 3, 2024

(30) Foreign Application Priority Data
Nov. 17, 2021   (FR) ..................... 2112148

(51) Int. Cl.
*H05K 5/02* (2006.01)
*H02M 7/00* (2006.01)
(Continued)

(52) U.S. Cl.
CPC .......... *H02M 7/003* (2013.01); *H01R 13/629* (2013.01); *H02M 1/0009* (2021.05)

(58) Field of Classification Search
CPC .............. H05K 5/0217; H05K 5/0017; H01R 13/629; H02M 7/003; H02M 1/0069
(Continued)

(56) References Cited

U.S. PATENT DOCUMENTS

2014/0140119 A1* 5/2014 Shinohara ............ H05K 7/1432
363/141
2014/0160823 A1* 6/2014 Uetake .................... H02M 1/44
363/141
(Continued)

FOREIGN PATENT DOCUMENTS

CN    111919374 A  * 11/2020  ............... H02M 7/48
CN    114172387 A  *  3/2022  ............... H05K 7/14
(Continued)

OTHER PUBLICATIONS

International Search Report for corresponding PCT/FR2022/000106 mailed Jan. 31, 2023.
Written Opinion for corresponding PCT/FR2022/000106 mailed Jan. 31, 2023.

*Primary Examiner* — Hung S. Bui
(74) *Attorney, Agent, or Firm* — Sandberg Phoenix & von Gontard P.C.

(57) ABSTRACT

The invention relates to an inverter comprising a casing, a circuit board (3), a power module, a connector guide (10) which is configured to keep male connectors of the power module in a given orientation, and a busbar system (6) connected to the power module (4) and comprising a ferromagnetic element (14) that is suitable for interacting with a current sensor (9) that is rigidly connected to the circuit board (3). The inverter (1) comprises two elongate centering elements such as centering fingers or pins (11) which extend in parallel and are arranged at a distance from one another, and are rigidly connected to a reference part of the inverter. In this instance, the two elongate centering elements pass through the circuit board (3), the connector guide (10) and (Continued)

the busbar system (6), with the casing (2) or part of the casing (2) forming the reference part. This ensures that the circuit board (3), the connector guide (10) and the busbar system (6) are correctly aligned with one another.

10 Claims, 5 Drawing Sheets

(51) Int. Cl.
  *H01R 13/629*   (2006.01)
  *H02M 1/00*    (2006.01)
(58) Field of Classification Search
  USPC ..................... 361/807, 728, 730, 809, 810
  See application file for complete search history.

(56) References Cited

U.S. PATENT DOCUMENTS

| | | | | |
|---|---|---|---|---|
| 2014/0168900 A1* | 6/2014 | Korich | ............... | H05K 7/14322 |
| | | | | 361/679.01 |
| 2020/0271696 A1* | 8/2020 | Nakada | ................ | G01R 31/42 |

FOREIGN PATENT DOCUMENTS

| | | | |
|---|---|---|---|
| EP | 2151913 | A2 | 2/2010 |
| EP | 2736160 | A1 | 5/2014 |
| EP | 3177123 | B1 | 2/2021 |
| WO | 2017081245 | A1 | 5/2017 |

\* cited by examiner

[Fig. 1]
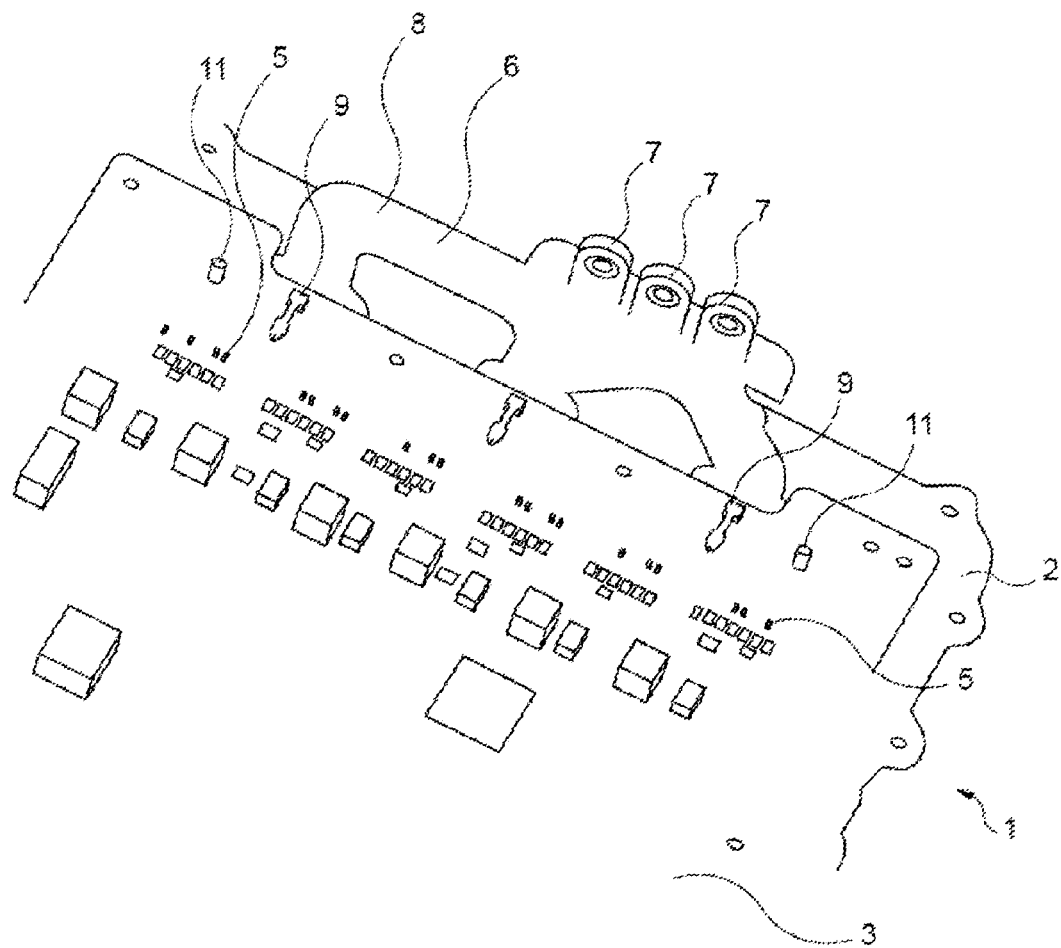
[Fig. 2]
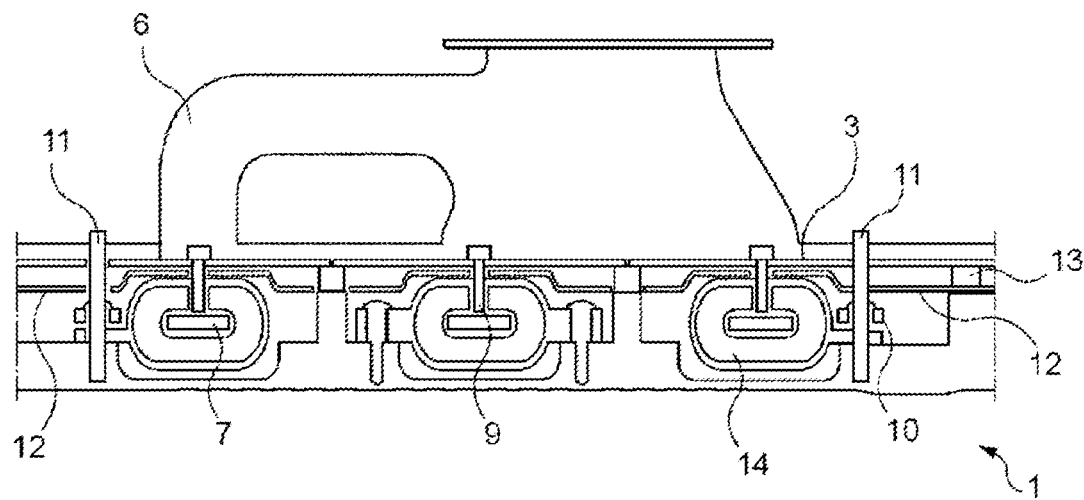

[Fig.3]
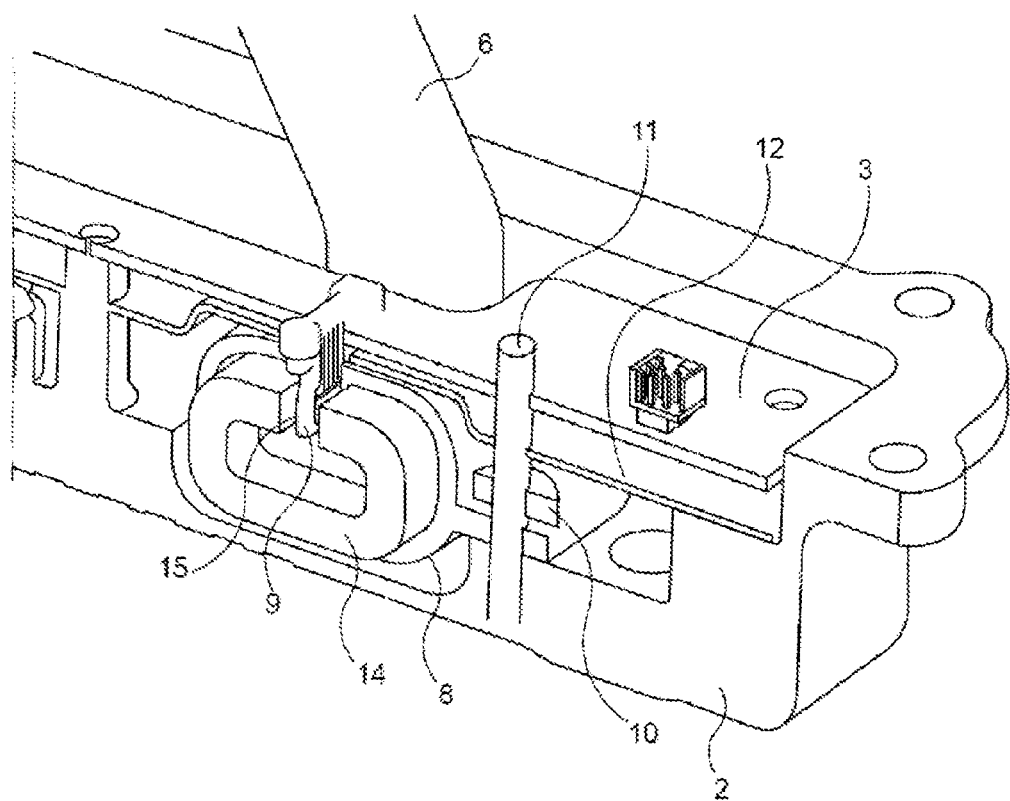
[Fig. 4]
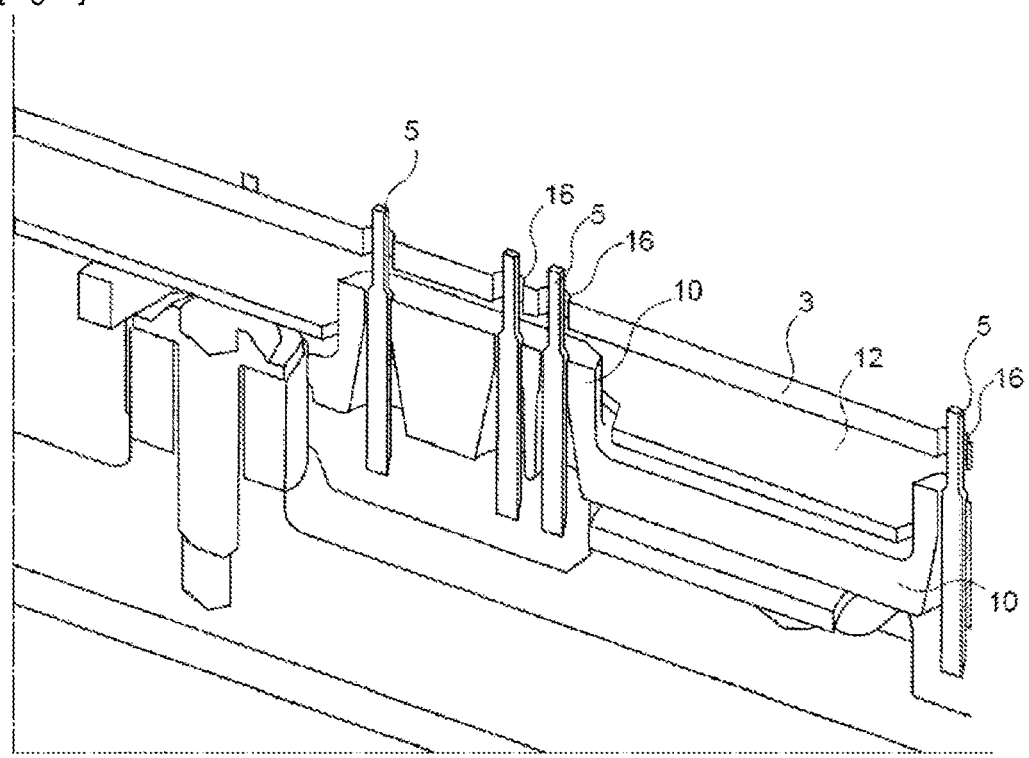

[Fig. 5]
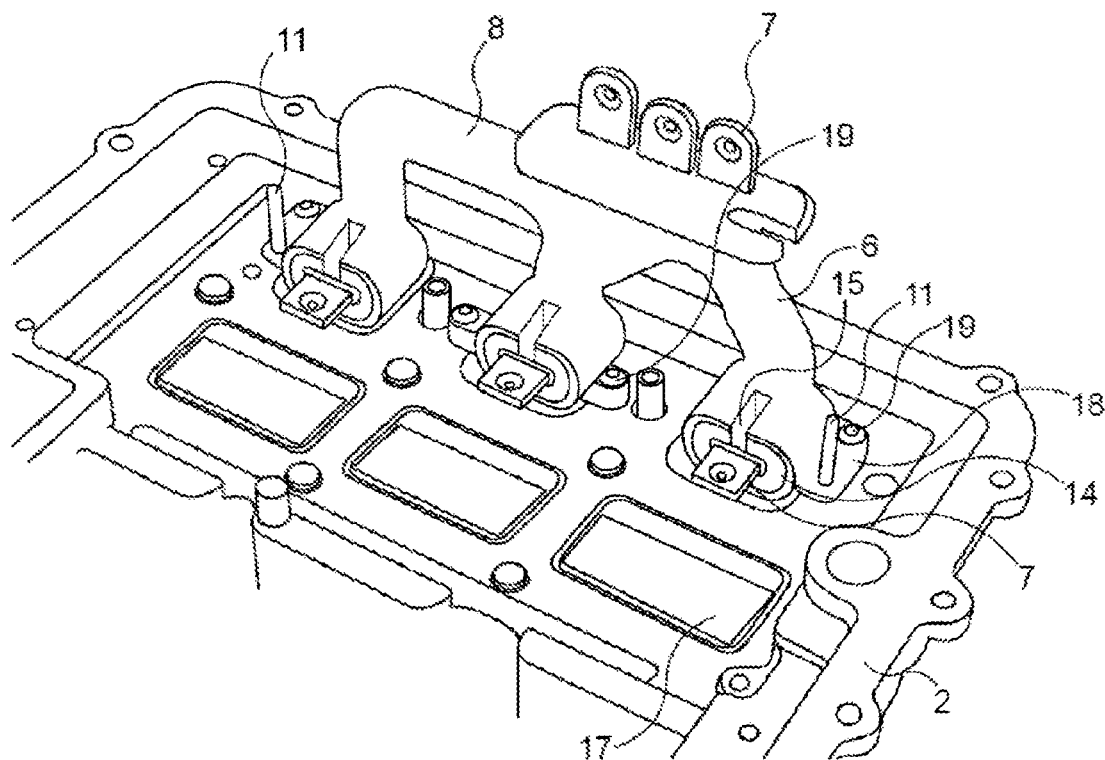
[Fig. 6]
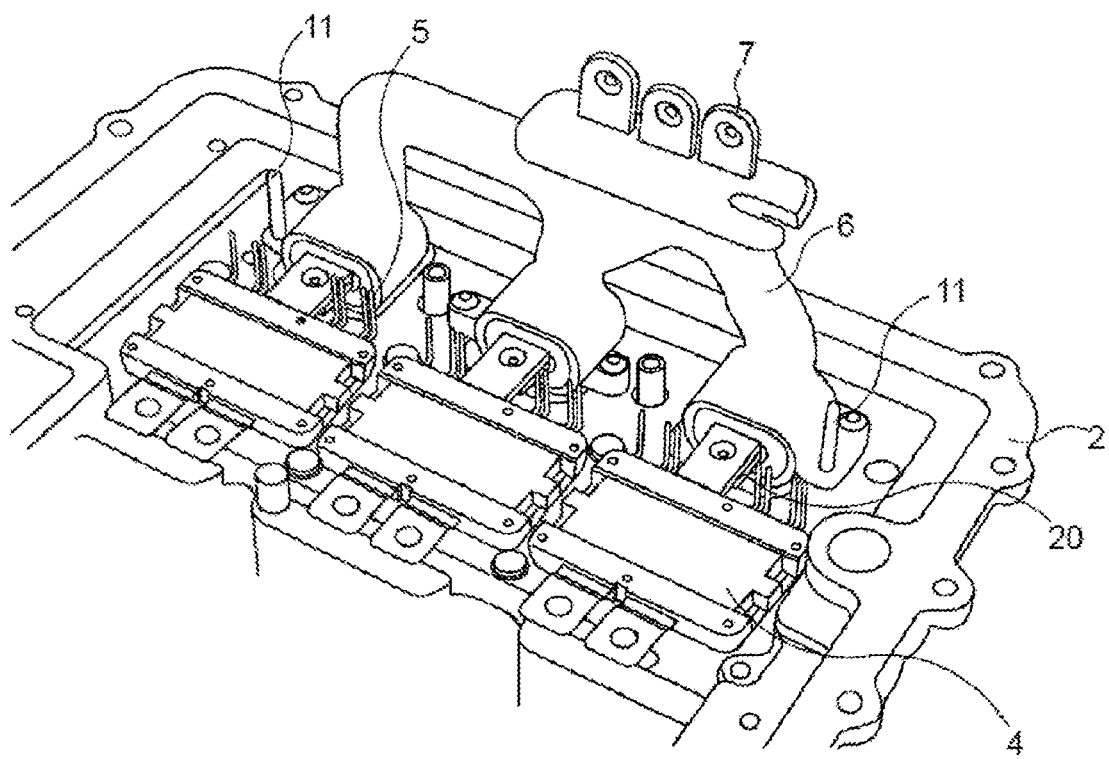

[Fig. 7]
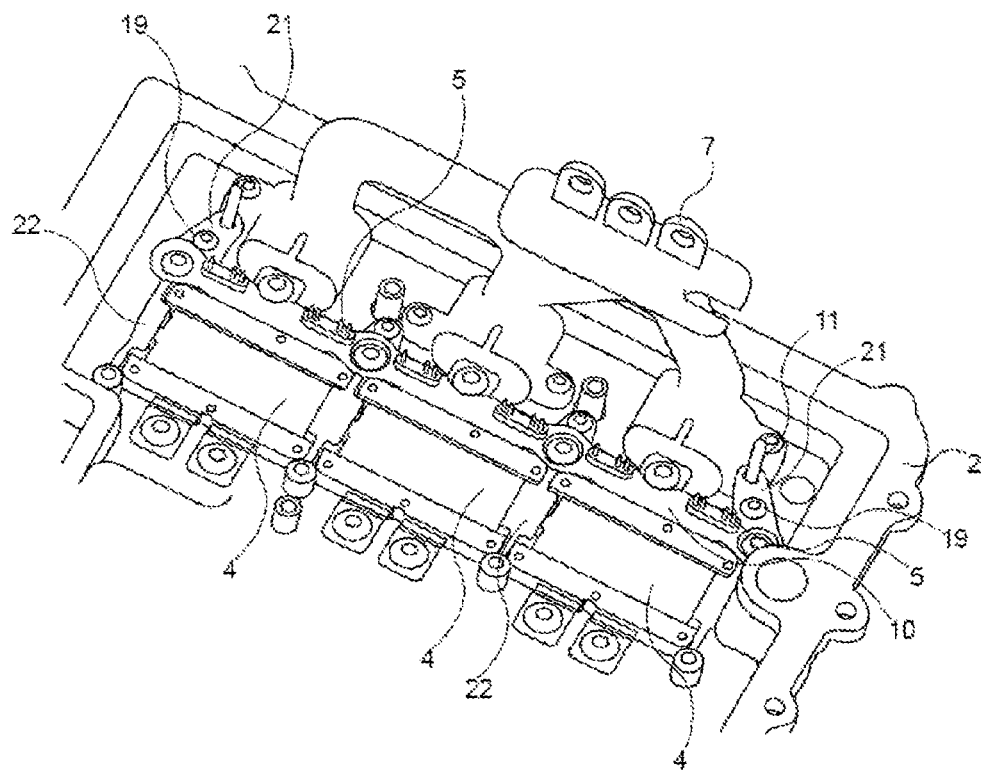
[Fig. 8]
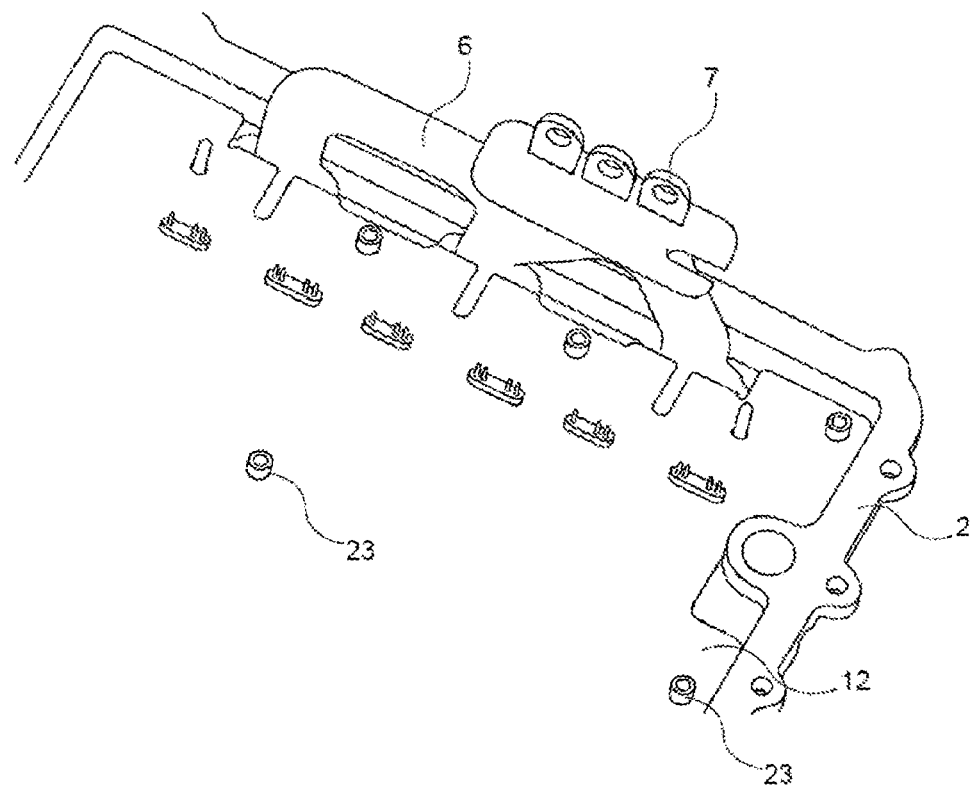

[Fig. 9]
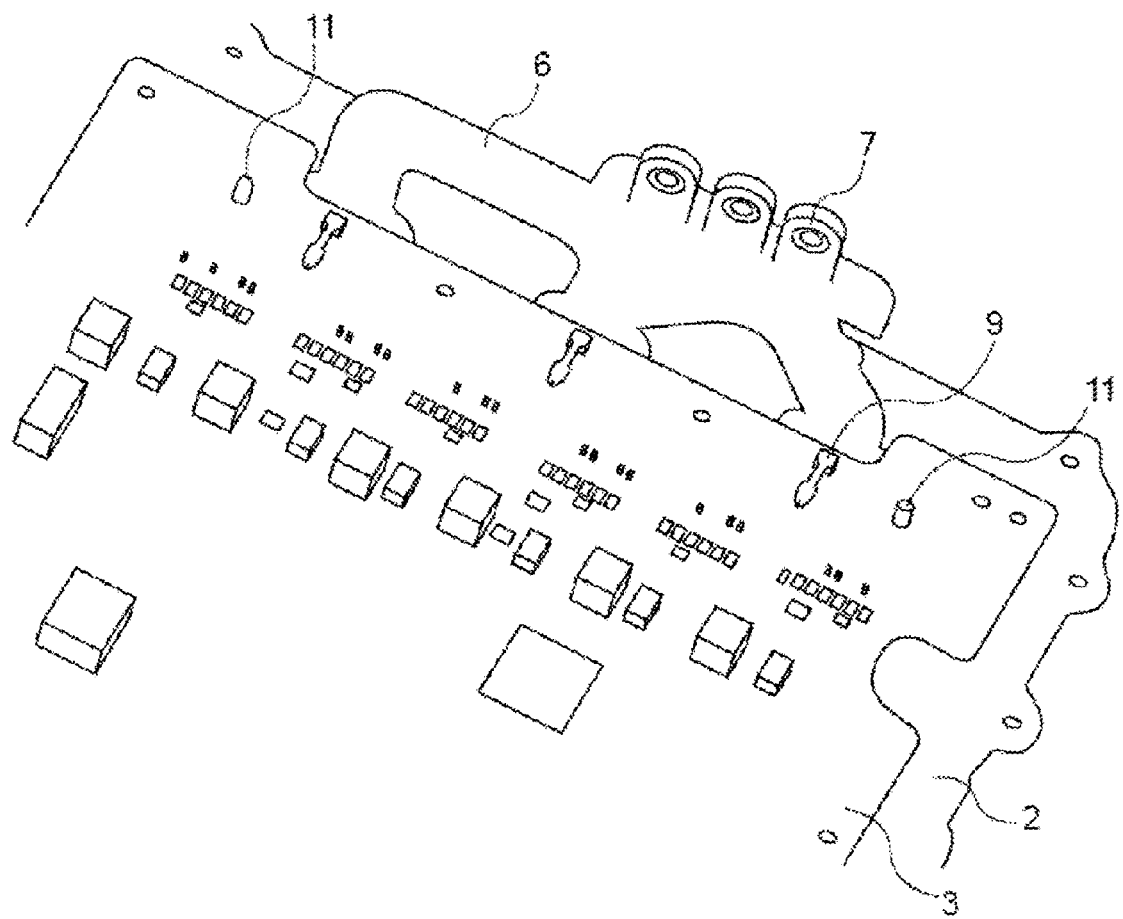
[Fig. 10]
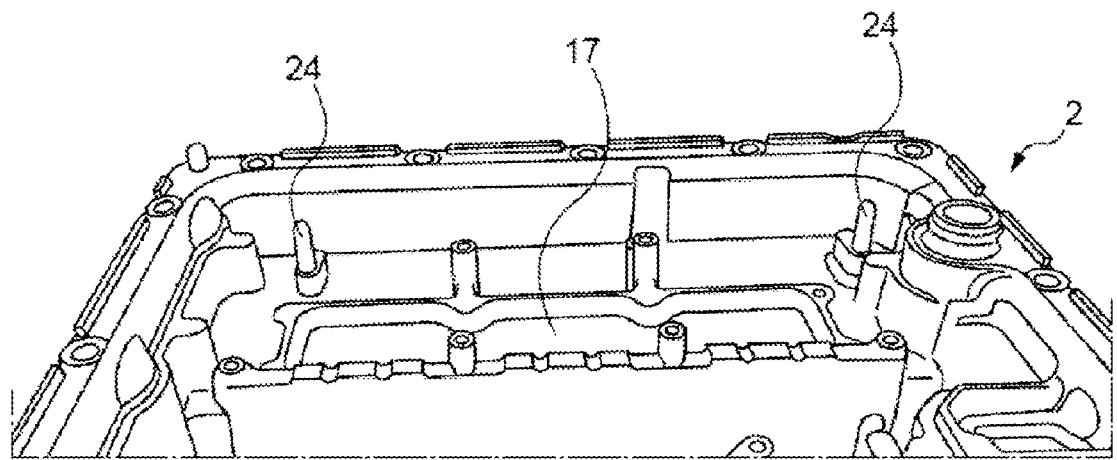

INVERTER COMPRISING A DEVICE FOR THE MUTUAL ALIGNMENT OF THREE COMPONENTS

CROSS-REFERENCE TO RELATED APPLICATIONS

This application is the US National Stage under 35 USC § 371 of International Application No. PCT/FR2022/000106, filed Nov. 14, 2022, which claims the priority of French application 2112148 filed on Nov. 17, 2021, the content (text, drawings and claims) of both said applications being incorporated by reference herein.

BACKGROUND

The methods and devices described herein relate to the field of assemblies comprising a circuit board interfacing with at least two other elements, and in particular to the field of inverters, such as inverters suitable for controlling the operation of an electric traction machine of an electric or hybrid vehicle.

In the field of power electronics, an inverter is a voltage converter used to generate alternating voltages and currents from an electrical energy source of a different voltage or frequency. In particular, an inverter can be used to generate the AC voltages required to operate an electric motor, whether synchronous or asynchronous, from a DC voltage source, such as an electric battery.

A polyphase inverter, for example a three-phase inverter, chops a DC voltage into a balanced polyphase (e.g. three-phase) sinusoidal voltage.

For this purpose, inverters comprise power modules comprising electronic switches, such as IGBTs (which stands for Insulated Gate Bipolar Transistor), whose openings and closings are appropriately controlled.

An inverter of this kind comprises an assembly of several components: circuit boards (control board and power board), a number of power modules, electrical connections in the form of interconnection bars (generally referred to as "busbars"), which are usually grouped together to form a busbar system, and, where appropriate, sensors, particularly current sensors. In this document, a "busbar system" is defined as a component comprising one or more busbars.

These components are usually enclosed in a protective housing, also known as a casing.

The various components mentioned above thus interface mechanically and/or electronically with one another in a relatively complex configuration.

Each power module is connected to the busbar system on the one hand, and to the driver board on the other, via pins soldered to the latter.

The current sensors are linked to the control board, and operate using the Hall effect. Each sensor must be precisely positioned in the opening of a ferromagnetic C-shaped element positioned around a busbar in order to measure the current in that busbar.

Assembling an inverter is therefore a complex task, requiring the use of measurements to ensure the correct positioning and orientation of components in relation to each other.

In order to simplify the inverter configuration, reduce the number of parts to be used, particularly screws, and increase compactness, it is possible to combine the functions of the control board and the driver board onto a single PCB (Printed Circuit Board). However, using just one circuit board instead of two makes it even more complex to position the various inverter components in relation to each other. Indeed, for example, very precise relative positioning between the circuit board and the control pins of the power modules on the one hand, and very precise relative positioning between the circuit board (which carries the current sensors) and the busbars on the other, are simultaneously required.

A number of general solutions have been developed to improve relative positioning between electronic components.

For example, EP3177123 proposes mounting a circuit board on which numerous components are to be soldered, on a circuit board support which is provided with guide holes. The guide holes are used to correct, to a certain extent, the orientation of the male contacts (pins) that are to pass through the PCB and be soldered to it.

However, this solution is imperfect in that it is complex, in that it may correct the orientation of the male contacts, but it does not guarantee the exact relative positioning of the components with respect to the board, and finally in that the resulting retention in position is hyperstatic, which should be avoided wherever possible.

SUMMARY

The aim of the described methods and devices is to optimize the relative positioning of the components of an inverter, while solving some or all of the problems indicated above.

Thus, related herein is an inverter comprising:
- a circuit board comprising a printed circuit;
- a power module with male connectors inserted into female connectors on the circuit board;
- a connector guide configured to maintain a given orientation between the male connectors;
- a busbar system, connected to the power module and comprising a ferromagnetic element that is suitable for interacting with a current sensor; and said current sensor, which is rigidly connected to the circuit board.

The inverter comprises two elongate centering elements extending parallel to and spaced from each other, and rigidly connected to a reference part of the inverter.

The two elongate centering elements pass through calibrated holes in the circuit board, connector guide, and busbar system.

The inverter also has a casing, and the casing or part of the casing forms the reference part.

This ensures that the circuit board, the connector guide and the busbar system are correctly aligned with one another as desired.

Alignment of the three components, i.e. the circuit board, the connector guide (and therefore the connectors it guides), and the busbar system, is easily achieved using two elongate centering elements. This makes it possible to use a single circuit board that combines the functions commonly divided between a control board and a driver board, while guaranteeing correct alignment thereof with respect to two other components, namely the busbar system and the connector guide. For example, the inverter may comprise a single circuit board.

Alignment refers in particular to the centering and rotation of components relative to one another. The two elongate centering elements, parallel and spaced apart, perform this alignment function isostatically.

A "calibrated" orifice means an orifice configured, in its shape and dimensions, to receive the pin, which is advantageously mounted clamped in the orifice. In particular, the tolerance stack-up between the elongate centering elements and the parts interfacing with the elongate centering elements enables precise positioning of the parts with respect to the elongate centering elements, and thus of the parts with respect to each other.

By using the casing as a reference part, the elongate centering elements not only ensure mutual alignment between the circuit board, busbar system, and connector guide, but also guarantee correct positioning of these elements in the inverter casing. This eliminates the need for additional positioning aids in the casing.

According to a configuration disclosed herein, which is not the object, the two elongate centering elements are rigidly connected to one of the components among the circuit board, the connector guide, and the busbar system, the component to which the elongate centering elements are linked then forming said reference part, and the two elongate centering elements pass through calibrated orifices in the other two components among the circuit board, the connector guide, and the busbar system.

The casing may have an inner wall forming at least one casing, adapted to receive at least one power module so as to pre-position it in the inverter during assembly.

The elongate centering elements can be pins.

Pins are elongate rectilinear inserts, prismatic or cylindrical.

The elongate centering elements can be centering fingers formed integrally with the casing.

The centering fingers (also known as indexing fingers) formed by the casing can have various cross-sections to ensure their centering function: circular, cross-shaped, etc. The centering fingers can be of constant cross-section, thus having a cylindrical or prismatic shape, or they can be slightly variable (for example, the centering fingers can be conical).

The inverter generally comprises a plurality of power modules, advantageously three power modules.

This is the traditional architecture of an inverter for obtaining a three-phase sinusoidal current, for example to supply an electric traction machine for a motor vehicle.

The connector guide can include passages into which the male connectors of the power modules are inserted in order to keep them in the desired orientation.

The ferromagnetic element can be a core with an open cross-section, for example C-shaped, and the current sensor is positioned in an air gap in the core. This is a conventional Hall sensor configuration, requiring precise positioning of the sensor in the air gap of the ferromagnetic element.

The inverter may further comprise a screen interposed between the power module(s) and the circuit board, said screen comprising calibrated holes through which the two elongate centering elements pass.

The elongate centering elements also align the screen with the other inverter components.

The male connectors can be pins, and the female connectors can be receiving holes formed in the circuit board, allowing the pins to be soldered. The busbar system may comprise one or more interconnecting bars partly embedded in a plastic overmold, said ferromagnetic element being embedded in the overmold. This configuration allows for simple inverter assembly and a high level of integration, and is made possible by the very good relative positioning between inverter components.

Also related is a method for assembling an inverter, said method comprising the steps of:
  providing a casing comprising two elongate centering elements extending parallel and arranged at a distance from one another, and rigidly connected to said casing;
  mounting a busbar assembly, with the two elongate centering elements passing through two calibrated holes in said busbar assembly, and securing the busbar assembly to the casing;
  installing power modules in the casing, said power modules comprising male connectors;
  mounting a connector guide around said male connectors to keep them in a given orientation relative to one another; said two elongate centering elements passing through calibrated holes in said connector guide;
  mounting a circuit board, the two elongate centering elements passing through calibrated holes in said circuit board, thereby aligning said circuit board with respect to the connector guide and with respect to the busbar assembly, so that the male connectors of the power modules are received in the corresponding female connectors of the circuit board and so that the current sensors rigidly connected to the circuit board are positioned in an air gap of a ferromagnetic element of the busbar system.

BRIEF DESCRIPTION OF THE FIGURES

Other features and advantages will become more apparent in the description below.

In the appended drawings, given by way of non-limiting examples:

FIG. 1 shows a partial three-dimensional view of an inverter according to one embodiment.

FIG. 2 shows a cross-sectional view of the inverter shown in FIG. 1.

FIG. 3 shows a three-dimensional cross-sectional view of one aspect.

FIG. 4 shows a three-dimensional cross-sectional view of another aspect.

FIGS. 5 to 9 show partial three-dimensional views of various stages in the assembly of the inverter shown in FIG. 1.

FIG. 10 shows a partial schematic three-dimensional view of an inverter casing that can be used in another embodiment.

DETAILED DESCRIPTION

FIG. 1 shows a partial three-dimensional view of an inverter according to one embodiment. The inverter shown is an inverter suitable for powering and controlling an electric traction machine in a motor vehicle.

The inverter 1 comprises a casing 2, suitable for accommodating the various components of the inverter 1. The casing 2 is advantageously made of aluminum alloy, but can also be made of any other suitable material: steel, plastic, composite plastic material, etc.

In FIG. 1, only the lower part of the casing 2 is shown. Once the inverter's internal components have been assembled, the casing is closed by a top cover, not shown, to protect the components.

The inverter comprises a circuit board 3. The circuit board 3 fulfills the functions of controlling and driving the inverter 1. The circuit board 3 comprises or consists of a printed circuit to which various electronic components and one or more microprocessors or microcontrollers are connected.

In particular, the circuit board makes it possible to control the inverter's power modules 4 (not visible in FIG. 1, as they are located beneath the circuit board 3, but visible in FIGS. 6 and 7 described below). Each power module has male connectors 5, in the form of pins, which are soldered to the circuit board 3. The male connectors 5 pass through the circuit board 3 via holes adapted to receive said male connectors and are soldered to it.

The inverter further comprises a busbar assembly 6. The busbar assembly comprises three interconnection bars 7 (or busbars), which are embedded in a plastic overmold 8.

Each busbar 7 is connected at one end to a power module. This connection can be made by welding or screwing. Its other end, which protrudes from the casing 2, is designed to be connected to the electrical machine supplied by the inverter, via another busbar or a flexible conductive link.

Each busbar 7 is equipped with a ferromagnetic element enabling the current flowing in said busbar to be measured by means of a current sensor 9 carried by the circuit board 3. Three current sensors 9 are provided in the embodiment shown in FIG. 1.

Each current sensor must be precisely positioned relative to the ferromagnetic element fitted to the corresponding busbar, as explained in greater detail below with reference to FIG. 3.

In addition, all the male connectors must be perfectly aligned with the female connectors on the circuit board when assembling the inverter. This correct positioning is made all the more complex by the fact that, during assembly, the power modules are not visible (because they are underneath the circuit board) and that there are many male connectors to align simultaneously: In the example shown, there are seven male connectors 5 per power module, making a total of twenty-one male connectors to align with respect to the circuit board 3. A connector guide 10 (visible in FIGS. 4 and 7) keeps the male connectors 5 oriented with respect to each other, but also ensures alignment with respect to the circuit board 3.

The described methods and devices propose to ensure alignment between the circuit board and the male connectors of the power modules on the one hand, and between the circuit board and the busbar assembly on the other, using a simple alignment system based on two elongate centering elements. In the example shown in FIGS. 1 to 9, the two elongate centering elements are two pins 11.

The pins 11 are straight elongate elements, preferably cylindrical, parallel to each other and at a distance from each other. Their ends can be beveled or rounded to facilitate the insertion of the components to be aligned.

FIG. 2 shows a cross-sectional view of the arrangement of the pins 11 in the inverter 1.

The two pins 11 are connected to the casing 2. More precisely, the pins 11 are inserted into shafts 12 formed in the casing 2, either with force or with very little play. The casing 2 thus forms a reference part against which the inverter components are aligned.

Each pin 11 passes through the busbar assembly 6, the connector guide 10, and the circuit board 3.

For this purpose, each of these components has two calibrated holes, cut into the component with small position and dimensional tolerances.

The mutual alignment of the three above-mentioned components is thus very precisely achieved. Moreover, this alignment is achieved isostatically: One of the two pins 11 can be considered as performing the centering function (precise relative positioning, not in relative orientation), while the other pin, thanks to its distance, ensures the orientation of the components.

In the example shown in FIG. 2, the inverter further comprises a screen 12, which is interposed between the power modules and the circuit board 3. The screen 12 can be made of metal (e.g. steel or aluminum) and is held at a distance from the circuit board 3 by spacers 13. The screen is also aligned using the two pins 11, as previously explained.

FIG. 2 also shows the configuration of the current sensors 9 and the corresponding ferromagnetic elements 14. This configuration can also be seen, specifically in FIG. 3.

FIG. 3 is a partial, three-dimensional cross-sectional view of the inverter 1. The cross-section is made in the plane marked by the two pins 11. For ease of reading, the pin 11, current sensor 9 and ferromagnetic element 14 shown in FIG. 3 are not cut. The ferromagnetic element has a "C" configuration (so this type of ferromagnetic element is commonly referred to as a "C-core").

Other configurations of ferromagnetic elements are also possible. The ferromagnetic element can have various open cross-sections providing an air gap, for example U-shaped or Ω (Omega).

The ferromagnetic element 14 thus has an opening, or air gap 15, into which the current sensor 9 must be precisely positioned.

The ferromagnetic element 14 surrounds a busbar 7. It is advantageously embedded in the busbar assembly 6, for example by being integrated into the plastic overmolding 8.

FIG. 3 thus illustrates the complexity of the very precise relative positioning that must be achieved between the current sensor 9 (and therefore the circuit board 3 to which it is connected) and the corresponding ferromagnetic element 14 (and therefore the busbar assembly into which it is integrated).

FIG. 4 shows another partial, cross-sectional and three-dimensional view of the inverter 1, with the problem of aligning the male connectors 5 of the power modules. The cross-section shown in FIG. 4 is in a plane parallel to the plane marked by the two pins 11, and passing through the male connectors 5. Each power module comprises a plurality of male connectors 5 for controlling the power module. These connectors can take the form of pins, as in the example shown, and thus have a long length, making their relative orientation rather uncertain. A connector guide 10 is used to ensure the relative positioning and orientation of the male connectors 5. The connector guide is a part, for example made of plastic, which has passages into which the male connectors of the power modules are inserted in order to keep them in the desired given orientation. The passages can have a tapered portion, so as to allow slight correction of the orientation and positioning of the pins in relation to each other when the connector guide 10 is placed around the pins.

The pins, or more generally the male connectors 5, must also be perfectly aligned with the female connectors 16 on the circuit board 3. In the example shown, the female connectors 16 are holes which allow the pins to pass through the circuit board 3 and be soldered to it.

FIGS. 5 to 9 show various stages in the assembly of the inverter shown in FIG. 1.

In FIG. 5, the lower part of the casing 2 is shown. The two pins 11 are assembled to the casing 2, ready to receive the stack of inverter components and ensure their alignment.

The casing 2 shown here has the particular feature of having recesses 17, each recess 17 being designed to receive a power module.

In the first assembly step shown in FIG. 5, the busbar assembly 6 is positioned in the casing 2. For this purpose, pins 11 are inserted into calibrated holes in the busbar assembly 6, for example positioned on the side lugs 18 of the busbar assembly 6 formed by the plastic overmold 8. Once aligned using the pins 11, the busbar assembly is secured to the casing, for example using screws 19.

In the next step, shown in FIG. 6, the three inverter power modules are inserted into the casing.

Each recess 17 and a part of the power module placed therein have somewhat matching shapes, enabling the latter to be pre-positioned. Each power module 4 is thus pre-positioned so that its output 20 is correctly positioned with respect to the busbar 7 to which it will be connected.

In the next step, shown in FIG. 7, a connector guide 10 is fitted over and around the male connectors 5. The connector guide is primarily positioned on the pins 11.

To achieve this, the pins 11 are inserted into calibrated holes in the connector guide 10. The connector guide 10, whose functional part is located in a plane distinct from that represented by the pins 11, has two arms 21 in which calibrated holes are formed to receive the pins 11.

Once the connector guide 10 is in position, thus ensuring correct alignment of all the male connectors 5 on the power modules 4, it can be secured to the casing (and/or, if applicable, to the busbar assembly that is itself secured to the casing), for example with screws 19.

The power modules can then be connected to the busbars 7 and secured in the casing 2 by means of clamps 22 (or other suitable fastening means). FIG. 8 shows the screen 12 being positioned above the power modules. The screen 12 is aligned by inserting pins 11 into calibrated holes in it. It should be noted, however, that the tolerances applied to these holes in screen 12 may be greater than for the other components, as the alignment of the screen need not be as precise as the mutual alignment of the busbar assembly, connector guide, and circuit board. Spacers 23 are provided on the screen 12.

FIG. 9 shows the assembly of the inverter's circuit board 3. The circuit board 3 is aligned with the other components by inserting the two pins 11 into calibrated holes in the board.

The circuit board is brought into contact with the spacers 23, which maintain the desired distance between the circuit board 3 and the screen 12. The circuit board 3 is then attached to the casing 2, using screws for example. The fastening screws can pass through the spacers 23 and the screen 12 to engage directly in the casing 2.

When the circuit board 3 is installed, thanks to the guidance provided by the pins 11, the circuit board 3 is correctly aligned both with respect to the male connectors 5, since the connector guide 5 is indexed in position by the pins 11, and with respect to the air gap 15 of the ferromagnetic elements 14, since the busbar assembly 6 is also indexed in position by the pins 11.

This ensures correct, risk-free board mounting. This is because the male connectors 5 penetrate precisely into the female connectors 16 on the circuit board as it is inserted and lowered along the pins 11 into the casing 2. It is also certain that the current sensors are correctly positioned in relation to the ferromagnetic element 14, i.e. in its air gap 15 in the example shown.

All the inverter components are now assembled, and the casing 2 can be closed.

Although described with reference to a particular embodiment shown in the figures described above, described methods and devices are obviously not limited to this embodiment alone.

The design shown in the figures described above uses the casing as the reference part to which the two pins 11 are attached.

The shown method has the advantage that no additional means are required to ensure the correct positioning of these three components in the inverter casing.

FIG. 10 illustrates another embodiment. More specifically, FIG. 10 shows an inverter casing 2 that can be used in another embodiment.

Like the casing 2 used in the embodiment shown in FIGS. 1 to 9, the casing 2 in FIG. 10 is advantageously made of an aluminum alloy, but may alternatively be formed from any other suitable material. In this case, only the lower part of casing 2 is shown in FIG. 10.

This lower part comprises a recess 17 adapted to receive and pre-position power modules, in this case three power modules.

The casing 2 in this embodiment forms a reference part against which the inverter components are aligned. However, instead of using insert pins, two centering fingers 24 are formed directly by the casing 2, i.e. they are integral with the casing.

In particular, the centering fingers 24 can be machined from the casing mass. Like the pins 11 of the embodiment previously described with reference to FIGS. 1 to 9, the centering fingers 24 are elongate rigid elements, which are located at a distance from each other and extend parallel to each other. They have a constant cross-section, giving them a generally cylindrical or prismatic shape. Their ends may nonetheless be beveled or rounded to facilitate the insertion of the components to be aligned.

The formation of centering fingers directly from the same part as the rest of the casing 2 offers several advantages. The tolerance stack-up for component alignment is simplified, as one dimension in this stack-up is eliminated compared to the solution using insert pins. The result is less dispersion and greater precision. Alternatively, a slightly higher tolerance can be applied in the formation of the centering fingers while still guaranteeing the desired alignment precision. In general, greater precision can be achieved because the centering fingers are integral with the casing. The centering fingers 24 and the rest of the casing 2 are machined in the same reference frame.

Finally, this solution eliminates a mounting operation, as the centering elements, i.e. the centering fingers, do not have to be fitted during assembly, as they are already present, formed by the casing.

This makes it easy to achieve correct alignment between three or more inverter components. This makes it possible to combine, on a single circuit board, functions which require precise physical positioning of the board relative to other inverter components, and which are generally managed by a plurality of boards. This also enables the board to be mounted reliably and safely "blind", i.e. without being able to visually check, when mounting the board in the inverter, that it is correctly aligned with the elements with which it interacts.

The invention claimed is:

1. An inverter comprising:
   a casing;
   a circuit board;
   a power module with male connectors inserted into female connectors on the circuit board;

a connector guide configured to maintain a given orientation between the male connectors;

a busbar system, connected to the power module and comprising a ferromagnetic element that is suitable for interacting with a current sensor;

said current sensor, which is rigidly connected to the circuit board, wherein the inverter comprises two elongate centering elements extending parallel and arranged at a distance from each other, and rigidly connected to a reference part of the inverter, and wherein the two elongate centering elements pass through calibrated holes in the circuit board, the connector guide, and the busbar system so as to ensure that the circuit board, the connector guide and the busbar system are correctly aligned with one another, wherein the casing or part of the casing forms the reference part, and wherein the inverter further comprises a screen interposed between the power module and the circuit board, said screen comprising calibrated orifices through which the two elongate centering elements pass.

2. The inverter according to claim 1, wherein the casing comprises an inner wall forming at least one recess, adapted to receive at least one power module so as to pre-position the at least one power module in the inverter during assembly.

3. The inverter according to claim 1, wherein the elongate centering elements are pins.

4. The inverter according to claim 1, wherein the elongate centering elements are centering fingers formed integrally with the casing.

5. The inverter according to claim 1 comprising a plurality of power modules.

6. The inverter according to claim 5, wherein the connector guide has passages into which the male connectors of the power modules are inserted in order to keep the male connectors in the desired given orientation.

7. The inverter according to claim 1, wherein the ferromagnetic element is a core with an open cross-section, and the current sensor is positioned in an air gap of the core.

8. The inverter according to claim 1, wherein the male connectors are pins and the female connectors are receiving holes formed in the circuit board and allowing the pins to be soldered.

9. The inverter according to claim 1 wherein the busbar system comprises one or more busbars partly embedded in a plastic overmolding, said ferromagnetic element being embedded in the overmold.

10. A method for assembling an inverter, said method comprising the steps of:

providing a casing comprising two elongate centering elements extending parallel and arranged at a distance from one another, and rigidly connected to said casing;

mounting a busbar assembly, with the two elongate centering elements passing through two calibrated holes in said busbar assembly, and securing the busbar assembly to the casing;

installing power modules in the casing, said power modules comprising male connectors;

mounting a connector guide around said male connectors to keep the male connectors in a given orientation relative to one another; said two elongate centering elements passing through calibrated holes in said connector guide, mounting a screen, said screen comprising calibrated orifices, said two elongate centering elements passing through the calibrated orifices, mounting a circuit board, the two elongate centering elements passing through calibrated holes in said circuit board, thereby aligning said circuit board with respect to the connector guide and with respect to the busbar assembly, so that the male connectors of the power modules are received in the corresponding female connectors of the circuit board and so that the current sensors rigidly connected to the circuit board are positioned in an air gap of a ferromagnetic element of the busbar system.

* * * * *